United States Patent
You et al.

(10) Patent No.: US 10,393,819 B2
(45) Date of Patent: Aug. 27, 2019

(54) METHOD AND APPARATUS FOR ESTIMATING STATE OF BATTERY

(71) Applicant: SAMSUNG ELECTRONICS CO., LTD., Suwon-si (KR)

(72) Inventors: Kaeweon You, Seoul (KR); SangDo Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 732 days.

(21) Appl. No.: 14/567,511

(22) Filed: Dec. 11, 2014

(65) Prior Publication Data

US 2016/0003917 A1 Jan. 7, 2016

(30) Foreign Application Priority Data

Jul. 2, 2014 (KR) .................. 10-2014-0082487

(51) Int. Cl.
*G01R 31/367* (2019.01)
*G01R 31/392* (2019.01)

(52) U.S. Cl.
CPC ......... *G01R 31/392* (2019.01); *G01R 31/367* (2019.01)

(58) Field of Classification Search
CPC .................. G01R 31/3679; G01R 31/3651
USPC ............................................. 702/63
See application file for complete search history.

(56) References Cited

U.S. PATENT DOCUMENTS

| | | | | |
|---|---|---|---|---|
| 8,046,181 B2 * | 10/2011 | Kang | ............... | G01R 31/3648 702/63 |
| 8,258,751 B2 | 9/2012 | Esnard | | |
| 8,589,097 B2 * | 11/2013 | Kirchev | ............. | G01R 31/3679 702/108 |
| 2005/0110466 A1 | 5/2005 | Shoji | | |
| 2009/0128097 A1 * | 5/2009 | Esnard | ................ | G01R 31/392 320/137 |
| 2012/0256599 A1 * | 10/2012 | Gu | .................... | G01R 31/3679 320/149 |
| 2012/0296586 A1 | 11/2012 | Kirchev | | |

FOREIGN PATENT DOCUMENTS

| | | |
|---|---|---|
| JP | 11-329512 A | 11/1999 |
| JP | 2009-236629 A | 10/2009 |
| JP | 2010-133919 A | 6/2010 |
| JP | 2013-210340 A | 10/2013 |
| JP | 2013-225441 A | 10/2013 |
| KR | 10-2013-0125141 A | 11/2013 |

OTHER PUBLICATIONS

Extended European Search Report dated Dec. 1, 2015 in counterpart European Patent Application No. 15152446.9 (13 pages in English).

* cited by examiner

*Primary Examiner* — Bo Fan
(74) *Attorney, Agent, or Firm* — NSIP Law

(57) ABSTRACT

A battery state estimation method and apparatus. The apparatus includes a time detector configured to detect a time during which a voltage level of a battery, being partially charged and discharged, changes through a constant current charge. The apparatus also includes a state of health (SoH) information estimator configured to estimate SoH information of the battery with the changed voltage level and the detected time, based on predetermined reference information.

23 Claims, 13 Drawing Sheets

| Cycle /611 | 3.4V~3.6V /621 | 3.6V~3.8V /622 | 3.8V~4.0V /623 | 4.0V~4.2V /624 | SoH /631 |
|---|---|---|---|---|---|
| 1 | 50 | 100 | 300 | 600 | 1 |
| ... | ... | 641 ... | 642 ... | ... | ... |
| 300 | 45 | 90 | 270 | 540 | 0.9 |
| ... | ... | 643 ... | 644 ... | ... | 651 ... |
| 500 | 40 | 80 /645 | 240 /646 | 480 | 0.8 /652 |

| Cycle | 3.4V~3.6V | 3.6V~3.8V | 3.8V~4.0V | 4.0V~4.2V | SoH |
|---|---|---|---|---|---|
| 1 | 25 | 50 | 150 | 300 | 1 |
| ... | ... | ... | ... | ... | ... |
| 300 | 225 | 45 | 135 | 270 | 0.9 |
| ... | ... | ... | ... | ... | ... |
| 500 | 20 | 40 | 120 | 240 | 0.8 |

| Cycle | 3.4V~3.6V | 3.6V~3.8V | 3.8V~4.0V | 4.0V~4.2V | SoH |
|---|---|---|---|---|---|
| 1 | 100 | 200 | 600 | 1200 | 1 |
| ... | ... | ... | ... | ... | ... |
| 300 | 90 | 180 | 540 | 1080 | 0.9 |
| ... | ... | ... | ... | ... | ... |
| 500 | 80 | 160 | 480 | 960 | 0.8 |

METHOD AND APPARATUS FOR ESTIMATING STATE OF BATTERY

CROSS-REFERENCE TO RELATED APPLICATION(S)

This application claims the benefit under 35 USC § 119(a) of Korean Patent Application No. 10-2014-0082487, filed on Jul. 2, 2014, in the Korean Intellectual Property Office, the entire disclosure of which is incorporated herein by reference for all purposes.

BACKGROUND

1. Field

The following description relates to a method and apparatus for estimating a state of a battery.

2. Description of Related Art

As environmental concerns and energy resource issues become more important, an electric vehicle (EV) has been highlighted as a vehicle of the future. The EV does not emit exhaust gas, and produces less noise as a regular gasoline vehicle because a battery formed in a single pack with a plurality of rechargeable and dischargeable secondary cells is used as a main power source in the EV.

In contrast with a regular gasoline powered vehicle, the battery functions as a fuel tank and an engine in the EV. Thus, to enhance a safety of a user of the EV, checking a state of the battery to ensure that the battery is in good working condition is important.

Recently, research is being conducted to increase a convenience of the user while more accurately monitoring a state of the battery.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an illustrative example, there is provided a battery information estimation apparatus. The apparatus includes a time detector configured to detect a time during which a voltage level of a battery, being partially charged and discharged, changes through a constant current charge; and a state of health (SoH) information estimator configured to estimate SoH information of the battery with the changed voltage level and the detected time, based on predetermined reference information.

The time detector may include a voltage detector configured to detect the changed voltage level; and a time measurer configured to measure the time during which the voltage level changes.

The apparatus may also include a charge state determiner configured to determine whether the battery is in a charge state, wherein the time detector is configured to detect the time during which the voltage level changes in response to the charge state determiner determining that the battery is in the charge state.

The predetermined reference information may include reference time information indicating information of the time during which the voltage level of the battery, being fully charged and discharged, changes through the constant current charge based on predetermined voltage intervals, and includes reference SoH information including SoH information of the battery.

A lookup table may include the reference time information and the reference SoH information.

The reference time information and the reference SoH information may be classified for each cycle in which the battery is fully charged and discharged.

The reference time information and the reference SoH information may be classified for each charging rate of the battery.

The SoH information estimator may be configured to detect a voltage interval mapped to the changed voltage level of the battery, being partially charged and discharged, from among the predetermined voltage intervals, and extract a time mapped to the detected time, from among items of time information corresponding to the mapped voltage interval in the reference time information.

The SoH information estimator may be configured to extract the time mapped to the detected time from the reference time information and, based on the mapped time, extract the SoH information of the battery, being partially charged and discharged, from the reference SoH information.

The time detector may be configured to detect a time during which the voltage level of the battery, being partially charged and discharged, changes to correspond to the mapped voltage interval, and the SoH information estimator may be configured to extract a time, which is mapped to the time during which the voltage level of the battery, being partially charged and discharged, changes to correspond to the mapped voltage interval, from among the items of time information corresponding to the mapped voltage interval.

In response to the voltage interval mapped to the changed voltage level being absent in the predetermined voltage intervals, the SoH information estimator may be configured to extract the voltage interval mapped to the changed voltage level by interpolating the predetermined voltage intervals, and extract the time mapped to the detected time from among the items of time information corresponding to the extracted voltage interval.

In response to the time mapped to the detected time being absent in the items of time information, the SoH information estimator may be configured to extract the time mapped to the detected time by interpolating the items of time information corresponding to the mapped voltage interval.

The SoH information estimator may be further configured to prevent the battery 110 from overcharging and overdischarging, and controls battery modules in the battery to be in equal charge states by performing cell balancing.

The SoH information estimator may be further configured to estimate a state of charge (SoC) information and a state of function (SoF) information, wherein the SoC information is information on an amount of charges held in the battery, and the SoF information indicates information on a degree to which the performance of the battery matches a predetermined condition.

In response to the battery being partially charged and discharged, the SoH information estimator may be configured to estimate the SoH information on the battery by detecting a constant current charging time (CCCT) based on the predetermined reference information.

The battery may be charged at a constant current until the voltage level of the battery reaches a predetermined voltage level, and when the voltage level of the battery reaches the predetermined voltage level, the battery is charged using a constant voltage until a current level reaches a predetermined current level.

In accordance with an illustrative example, there is provided a battery information preprocessing apparatus, including a state change information acquirer configured to acquire information about a state change of a battery being fully charged and discharged during cycles; a reference time information detector configured to detect, based on the information about the state change, reference time information of a time during which a voltage level of the battery changes through a constant current charge based on predetermined voltage intervals for each of the cycles; and a reference state of health (SoH) information detector configured to detect, based on the information about the state change, reference SoH information indicating SoH information on the battery for each of the cycles.

The state change information acquirer may be configured to acquire information on a capacity change of the battery based on the cycles in which the battery is fully charged and discharged.

The reference SoH information detector may be configured to operate a ratio between a capacity of the battery corresponding to first full charging and discharging and a capacity of the battery corresponding to $N^{th}$ full charging and discharging, N being a number of the cycles, and extract SoH information of the battery corresponding to the $N^{th}$ full charging and discharging.

The reference time information detector may be configured to classify a voltage interval in which the battery is fully charged into the predetermined voltage intervals.

The reference time information detector may be configured to classify the reference time information for each charging rate of the battery, and the reference SoH information detector may be configured to classify the reference SoH information for each charging rate of the battery.

The apparatus may also include a storing unit configured to store the reference time information and the reference SoH information.

In accordance with an illustrative example, there is provided a battery information estimation method, including detecting a time during which a voltage level of a battery being partially charged and discharged, changes through a constant current charge; and estimating state of health (SoH) information of the battery with the changed voltage level and the detected time, based on predetermined reference information.

In accordance with a further illustrative example, there is provided a battery information preprocessing method, including acquiring information on a state change of a battery being fully charged and discharged during cycles; detecting, based on the information on the state change, reference time information of a time during which a voltage level of the battery, changes through a constant current charge based on predetermined voltage intervals for each of the cycles; and detecting, based on the information on the state change, reference state of health (SoH) information indicating SoH information of the battery for each of the cycles.

In accordance with an illustrative example, there is provided a battery information estimation method, including acquiring information on a state change of a first battery, which is fully charged and discharged, during cycles; detecting, based on the information on the state change of the first battery, reference time information of a time during which a voltage level of the first battery is changed, through a constant current charge, based on predetermined voltage intervals for each of the cycles; detecting, based on the information on the state change of the first battery, reference state of health (SoH) information indicating SOH information on the first battery for each of the cycles; detecting a time during which a voltage level of a second battery, which is partially charged and discharged, changes through the constant current charge; and estimating SoH information on the second battery corresponding to the changed voltage level and the detected time based on the reference time information and the reference SoH information.

Other features and aspects will be apparent from the following detailed description, the drawings, and the claims.

BRIEF DESCRIPTION OF THE DRAWINGS

These and/or other aspects will become apparent and more readily appreciated from the following description of the embodiments, taken in conjunction with the accompanying drawings in which:

FIGS. 5 through 7 are diagrams illustrating examples of estimating state of health (SOH) information, in accordance with an embodiment.

FIGS. 8A and 8B are diagrams illustrating examples of predetermined reference information classified based on a charging rate of the battery, in accordance with an embodiment.

Figure 1:
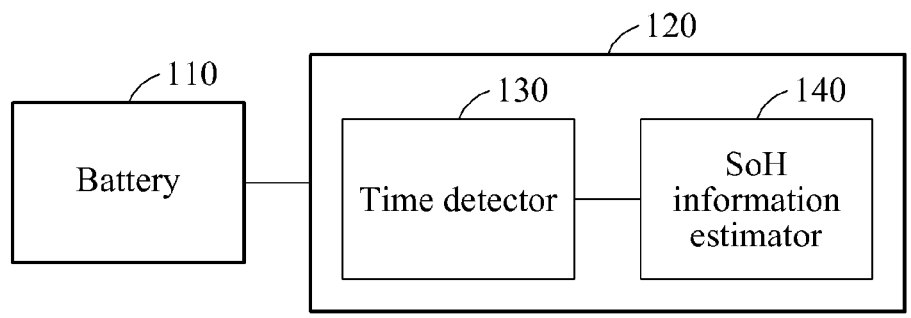
FIG. 1 is a block diagram illustrating an example of a battery structural configuration, in accordance with an embodiment.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein.

Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "include" and/or "have," when used in this specification, specify the presence of stated features, integers, steps, operations, elements, components or combinations thereof, but do not preclude the presence or addition of one or more other features, integers, steps, operations, elements, components, and/or groups thereof.

Unless otherwise defined, all terms including technical and scientific terms used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Like reference numerals in the drawings denote like elements, and redundant descriptions of like elements will be omitted herein. When it is determined a detailed description of a related known function or configuration they may make the purpose of the present invention unnecessarily ambiguous in describing the present invention, the detailed description will be omitted herein.

FIG. 1 is a block diagram illustrating a battery structural configuration 100, in accordance with an embodiment.

Referring to FIG. 1, the battery structural configuration 100 includes a battery 110, and a battery control apparatus 120, for example, a battery management system (BMS). Although the battery 110 and the battery control apparatus 120 are illustrated and described herein below as separate structural elements, a person of ordinary skill in the relevant art will appreciate that the battery 110 may be configured to include the battery control apparatus 120 as an integral structural configuration. The battery 110 supplies power to a driving device, for example an electric vehicle (EV), including a battery pack, and may include a plurality of battery modules. The battery modules may be connected to one another in parallel, in series or a combination of both. In an example, the battery modules are secondary batteries, for example, lithium ion batteries. Also, a capacity for each of the battery modules may be identical to or different from one another. In one example, the battery structural configuration 100 is an energy storage system (ESS).

The battery control apparatus 120 monitors a state of the battery 110, and controls the battery 110. The battery control apparatus 120 performs a thermal control of the battery modules in the battery 110. Also, the battery control apparatus 120 prevents the battery 110 from being overcharged and overdischarged, and controls the battery modules to be in equal charge states by performing cell balancing. Accordingly, an energy efficiency of the battery 110 increases, and a life of the battery 110 is extended.

Also, the battery control apparatus 120 estimates state of health (SoH) information, state of charge (SoC) information, state of function (SoF) information, and performs other diagnostics of the battery modules. The SoH information is information about a degree of degradation in a performance of the battery 110, in comparison to a performance provided during manufacture of the battery 110. The SoC information is information on an amount of charges held in the battery 110, and the SoF information indicates information on a degree to which the performance of the battery 110 matches a predetermined condition.

The battery control apparatus 120 provides the SoH information, the SoC information, and the SoF information to an electronic control unit (ECU). In an example, the battery control apparatus 120 communicates with the ECU based on a controller area network (CAN) communication.

To estimate the SoH information, the battery control apparatus 120 uses a predetermined SoH information estimation method. For example, the battery control apparatus 120 estimates the SoH information based on an open circuit voltage (OCV) method, through which an open voltage of the battery 110 is measured. In the alternative, the battery control apparatus 230 estimates the SoH information based on an electrochemical impedance spectroscopy (EIS) method, through which an internal resistance of the battery 110 is measured to estimate the SoH information. In this example, the OCV method and the EIS method are performed while the battery 110 is in an electrically stable state.

When the battery 110 is partially charged and discharged, the battery control apparatus 120 estimates the SoH information on the battery 110 by detecting a constant current charging time (CCCT) based on predetermined reference information. Based on a constant current/constant voltage (CC/CV) charging method, the battery 110 is charged at a constant current until a voltage level of the battery 110 reaches a predetermined voltage level. When the voltage level of the battery 110 reaches the predetermined voltage level, the battery 110 is charged using a constant voltage until a current level reaches a predetermined current level. For example, when the voltage level of the battery 110 is between 2.7 volts (V) and 4.2 V, the battery 110 is charged at the constant current until the voltage level reaches 4.2 V. When the voltage level reaches 4.2 V, the battery 110 is charged at the constant voltage until the current level of the battery 110 reaches 0.1 amperes (A) while maintaining a voltage level of 4.2 V. The predetermined reference information includes reference time information indicating information about a time during which a voltage level of a battery fully charges and discharges at a constant current charge during predetermined voltage intervals, and reference SoH information indicating SoH information on the battery 110 fully charging and discharging. Hereinafter, full charging and discharging refers to charging and discharging performed until the voltage level of the battery 110 reaches a fully charged level and a fully discharged level. Also, partial charging and discharging refers to charging and discharging performed on the voltage level of the battery 110 in a range between the fully charged level and the fully discharged level. The predetermined reference information is generated and stored in advance in the battery control apparatus 120. In an example, the predetermined reference information is generated in a battery information preprocessing apparatus 210 of FIG. 2, and stored in the battery control apparatus 120 in advance. The reference time information and the reference SoH information are classified for each cycle in which the full charging and discharging is performed. In this example, the reference SoH information may correspond to the reference time information. In an example, the reference time information and the reference SoH information are included in a lookup table, and are classified based on a charging rate of the battery 110.

The battery control apparatus 120 includes a time detector 130 and an SoH information estimator 140.

The time detector 130 detects a time during which the battery 110 that is partially charged and discharged, changes through the constant current charge. In an example, when the battery 110 is partially charged and discharged, the time detector 130 detects the voltage level of the battery 110 that changed through the constant current charge, and measures the time during which the voltage level of the battery 110 changes.

The SoH information estimator 140 estimates the SoH information on the battery 110 corresponding to the changed voltage level of the battery 110 and the time detected by the time detector 130, based on the predetermined reference information. The SoH information estimator 140 extracts a time mapped of the detected time from the reference time information, and extracts the SoH information of the battery 110 from the reference SoH information based on the mapped time. In an example, the SoH information estimator 140 detects a voltage interval mapped to the voltage level of the battery 110 that changed at the constant current charge from among voltage intervals included in the predetermined reference information. The SoH information estimator 140 extracts a time mapped of the time detected by the time detector 130 from items of time information corresponding to the mapped voltage interval in the reference time information.

Figure 2:
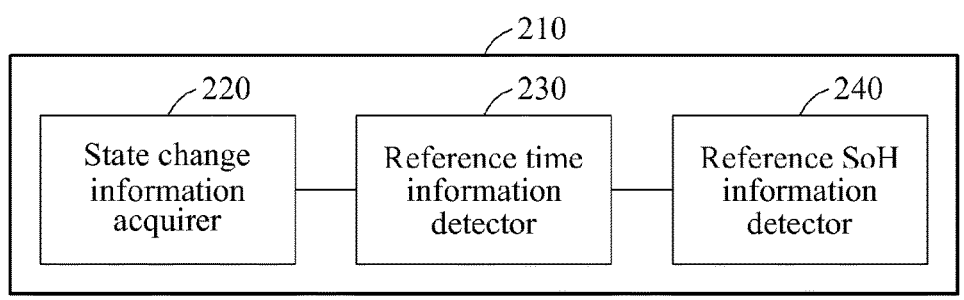
FIG. 2 is a block diagram illustrating an example of a battery information preprocessing apparatus, in accordance with an embodiment.

FIG. 2 is a block diagram illustrating the battery information preprocessing apparatus 210, in accordance with an embodiment.

Referring to FIG. 2, the battery information preprocessing apparatus 210 includes a state change information acquirer 220, a reference time information detector 230, and a reference SoH information detector 240. The battery information preprocessing apparatus 210 generates predetermined reference information and provides the generated predetermined reference information to a battery control apparatus. In turn, the battery control apparatus estimates SoH information of a battery by measuring a CCCT when the battery is partially charged and discharged.

The state change information acquirer 220 acquires information about a state change of a battery being fully charged and discharged during a plurality of cycles. In this example, the information on the state change is classified based on a full charging rate of the battery. The state change information acquirer 220 fully charges and discharges the battery provided in a state of production, in the plurality of cycles and monitor the battery, thereby acquiring the information on the state change of the battery. In an example, the information on the state change of the battery includes information about a capacity of the battery based on the full charging and discharging. In this example, the state change information acquirer 220 acquires the information about on the capacity of the battery based on a number of cycles in which the battery is fully charged and discharged, and by measuring the capacity of the battery for each of the plurality of cycles. Also, the state change information acquirer 220 acquires the information on the state change on the battery from a predetermined database or an external device.

The reference time information detector 230 classifies the voltage interval in which the battery is fully charged through the constant current charge, into the plurality of voltage intervals. In this example, a number of the plurality of the voltage intervals may be determined in advance, or set by the reference time information detector 230. For example, when the voltage interval in which the battery is fully charged through the constant current charge is from 3.4 V to 4.2 V and when four voltage intervals are set to be provided, the reference time information detector 230 classifies the voltage interval into a first interval from 3.4 V to 3.6 V, a second interval from 3.6 V to 3.8 V, a third interval from 3.8 V to 4.0 V, and a fourth interval from 4.0 V to 4.2 V.

Based on the information on the state change of the battery, the reference time information detector 230 detects reference time information. The reference time information is information about a time during which a voltage level of a battery being fully charged and discharged is changed, based on predetermined voltage intervals through the constant current charge for each of the cycles in which the battery is fully charged and discharged. In an example, the reference time information detector 230 classifies the information about the state change of the battery based on the number of cycles in which the battery is fully charged and discharged and classifies the classified information into the voltage intervals, thereby detecting the reference time information. Also, the reference time information detector 230 classifies the reference time information for each charging rate. For example, the reference time information detector 230 provides the reference time information in a lookup table, and classifies the lookup for each charging rate.

The reference SoH information detector 240 detects reference SoH information indicating SoH information on the battery based on the information on the capacity of the battery acquired by the state change information acquirer, for each of the cycles in which the battery is fully charged and discharged. In this example, first full charging and discharging refers to full charging and discharging initially performed in a period subsequent to manufacture of the battery. In an example, the reference SoH information of the battery may be calculated using Equation 1.

$$SoH = \frac{C_i}{C_1}$$ [Equation 1]

In Equation 1, SoH denotes the SoH information on the battery, C1 denotes a capacity of the battery corresponding to the first full charging and discharging, and $C_i$ denotes a capacity of the battery corresponding to full charging and discharging. For example, when the capacity of the battery corresponding to $i^{th}$ first full charging and discharging is 30 kilowatt-hours (kWh) and a capacity of the battery corresponding to $200^{th}$ full charging and discharging is 24 kWh, the reference SoH information detector 240 operates SoH information on the battery fully charged and discharged 200 times, to be 0.8. In an example, the reference SoH information is included in the lookup table with the reference time information.

The battery information preprocessing apparatus 210 also includes a storing unit (not shown). The storing unit may store the reference time information and the reference SoH information.

The battery information preprocessing apparatus 210 provides the reference time information and the reference SoH information stored in the storing unit to the battery control apparatus 120 of FIG. 1. Based on the provided reference time information or the reference SoH information, the battery control apparatus 120 extracts the SoH information on the battery 110 being partially charged and discharged.

Figure 3:
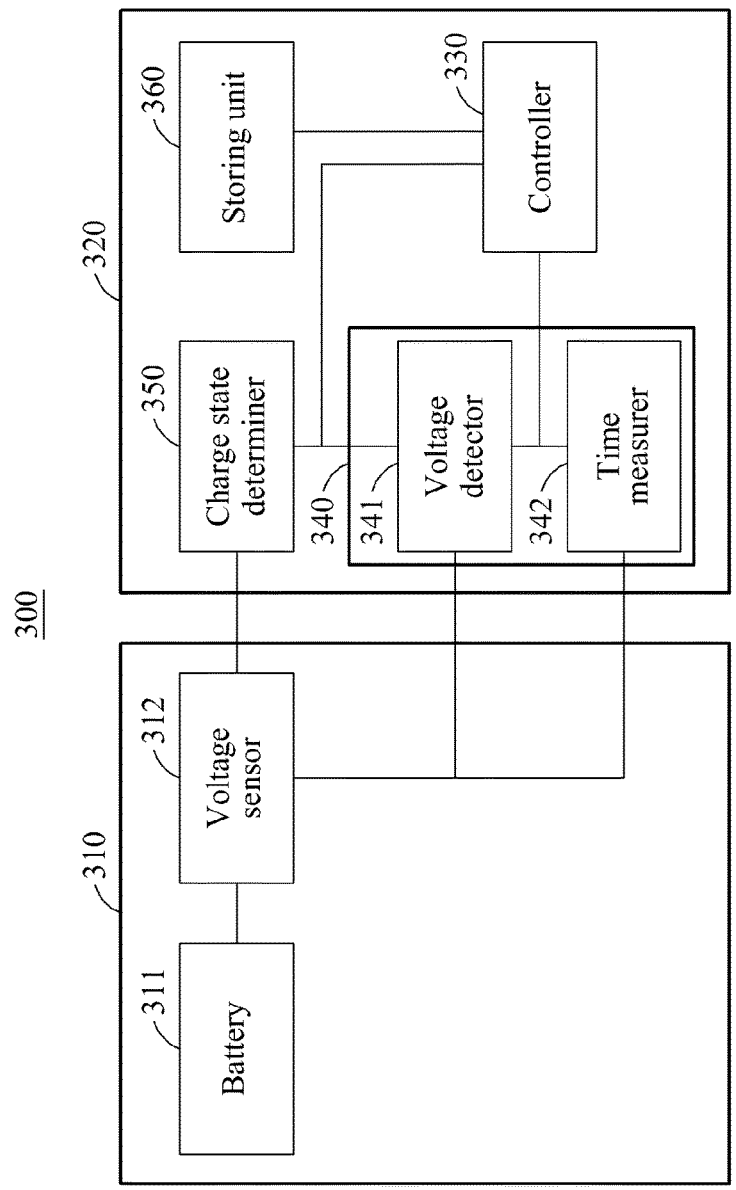
FIG. 3 is a block diagram illustrating an example of a battery information estimation apparatus, in accordance with an embodiment.

FIG. 3 is a block diagram illustrating a battery information estimation apparatus 320, in accordance with an embodiment.

Referring to FIG. 3, a battery system 300 includes a battery pack 310 and the battery information estimation apparatus 320. In accordance with an illustrative example, the battery information estimation apparatus 320 is a battery control apparatus, for example, a BMS.

The battery pack 310 includes a battery 311 and a voltage sensor 312. The battery 311 includes battery modules, and each of the plurality of battery modules includes battery cells. The voltage sensor 312 senses a voltage level of the battery 311. The voltage sensor 312 measures voltage levels of the battery modules or voltage levels of the cells as well as the voltage level of the battery 311.

The battery information estimation apparatus 320 includes a controller 330, a time detector 340, a charge state determiner 350, and a storing unit 360. The controller 330 refers to, for example, an SoH information estimator. When the battery 311 is partially charged and discharged, the battery information estimation apparatus 320 estimates SoH information on the battery 311. The battery information estimation apparatus 320 estimates SoH information on the battery modules included in the battery 311 as well as the SoH information on the battery 311.

In an example, the battery 311 is connected with an external charge source to be partially charged and discharged. In this example, the battery information estimation apparatus 320 extracts the SoH information on the battery 311 being partially charged and discharged by the external charge source.

In another example, the battery information estimation apparatus 320 includes a charging and discharging unit (not shown) to partially charge and discharge the battery 311. The charging and discharging unit enables the battery modules to be partially charged and discharged from one another. In this example, the partial charging and discharging is performed in the battery modules without a power supply from the external charge source. In an example, the battery pack 310 includes a switching unit (not shown). For example, the switching unit is a direct current (DC)-to-DC (DC/DC) converter. The charging and discharging unit controls the DC/DC converter to deliver a DC power of the first battery module to the second battery module. The switching unit connects the battery modules to one another such that charges of a first battery module are moved to a second battery module included in the battery 311. As a result, the first battery module is partially discharged, and the second battery module is partially charged. In this example, the battery information estimation apparatus 320 extracts SoH information from the second battery module.

The controller 330 controls other units included in the battery information estimation apparatus 320 to extract the SoH information on the battery 311. In an example, the controller 330 includes a micro-controller unit (MCU).

The time detector 340 detects the time during which the voltage level of the battery 311, being partially charged and discharged, is changed through the constant current charge. The time detector 340 includes a voltage detector 341 and a time measurer 342. The voltage detector 341 detects the voltage level of the battery 311 changed through the constant current charge. For example, the voltage detector 341 detects the changed voltage level by acquiring information on a voltage of the battery 311 from the voltage sensor 312. The time detector 342 measures a specific time or a predetermined time period during which the voltage level of the battery 311 is changed. In an example, the time measurer 342 includes a real time clock (RTC). The time measurer 342 measures a time during which the voltage sensor 312 senses the voltage level of the battery using the RTC, and acquires the time during which the voltage level of the battery 311 is changed.

The charge state determiner 350 determines whether the battery 311 is charged. The voltage level of the battery 311 changes in response to charging of the battery 311 and due to other reasons. For example, when a driving device is inoperable, the voltage level of the battery 311 temporarily changes while the battery system 300 is being installed in the driving device. The charge state determiner 350 determines whether the voltage level is changed in response to the charging or due to the other reasons. When the charge state determiner 350 determines that the battery 311 is charged, the time detector 340 detects the time during which the voltage level of the battery 311, being partially charged and discharged, changes through the constant current charge.

The controller 330 estimates the SoH information on the battery 311 to correspond to the time detected by the time detector 340 and the changed voltage level of the battery 311 based on predetermined reference information. The storing unit 360 includes the predetermined reference information. The predetermined reference information is generated in the battery information preprocessing apparatus 210 of FIG. 2, and stored in advanced in the storing unit 360. The predetermined reference information includes reference time information indicating information on a time or in a predetermined time period during which a voltage level of a battery, being fully charged and discharged, changes based on predetermined voltage intervals through the constant current charge, and reference SoH information indicating SoH information on the battery. In this example, the reference SoH information corresponds to the reference time information. The reference time information and the reference SoH information may be classified based on a number of cycles in which full charging and discharging is performed. In an example, the reference time information and the reference SoH information are included in a lookup table, and classified based on a charging rate of the battery 311.

The controller 330 extracts a time mapped to the time detected by the time detector 340 from the reference time information, and estimates the SoH information on the battery 311 from the reference SoH information based on the mapped time. In an example, the controller 330 detects a voltage interval mapped to the voltage level of the battery 311 changed through the constant current charge from among voltage intervals included in the predetermined reference information, and extracts a time mapped to the time detected by the time detector 340 from items of time information corresponding to the mapped voltage interval in the reference time information. In this example, the items of time information refers to information obtained by classifying a number of times during which the voltage level of the battery 311 is changed based on the mapped voltage interval, for each of the cycles in which the full charging and discharging is performed.

In an example, the time detector 340 detects a time during which the voltage level of the battery 311 changes to correspond to the mapped voltage interval. The controller 330 extracts a time mapped to the time during which the voltage level of the battery 311 is changed to correspond to the mapped voltage interval, from the items of time information corresponding to the mapped voltage interval.

When the voltage interval mapped to the voltage level of the battery 311 changed through the constant current charge is absent in the voltage intervals included in the predetermined reference information, the controller 330 extracts the voltage interval mapped to the changed voltage level by interpolating the voltage intervals, and extracts a time mapped to the time detected from the items of time information corresponding to the extracted voltage interval.

When the time mapped to the time detected by the time detector 340 is absent in the items of time information corresponding to the mapped voltage interval, the controller 330 extracts the time mapped to the time detected by the time detector 340 by interpolating the items of time information.

The controller 330 extracts the SoH information on the battery 311 from the reference SoH information based on the time mapped to the time detected by the time detector 340.

Figure 4A:
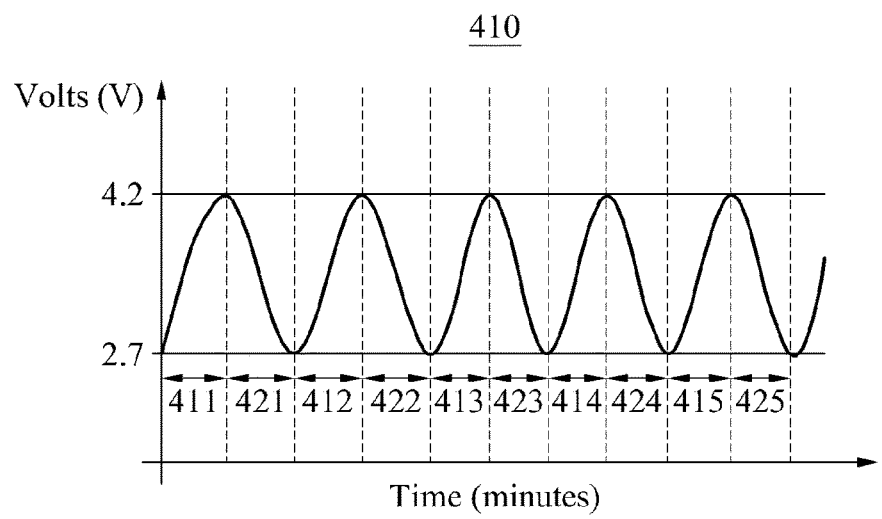
FIGS. 4A and 4B are diagrams illustrating an example of full charging and discharging of the battery, and an example of partial charging and discharging of the battery, in accordance with an embodiment.
Figure 4B:
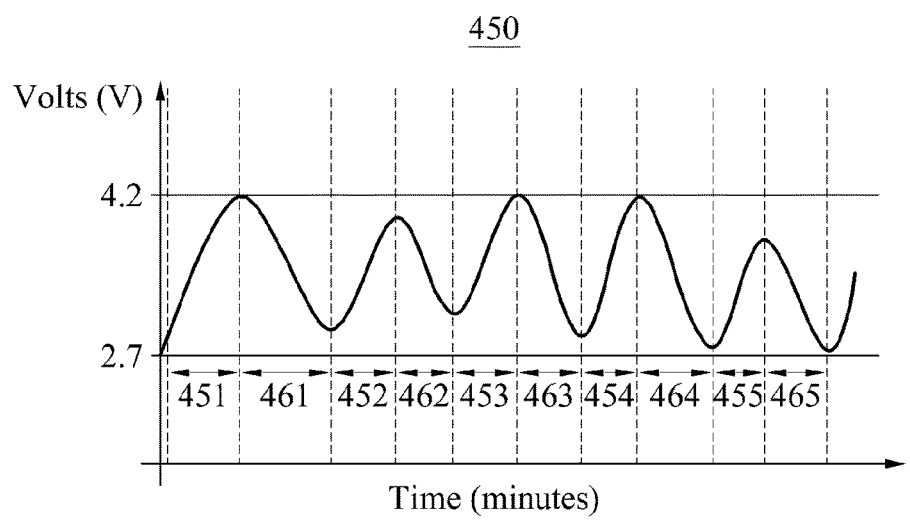

FIGS. 4A and 4B are diagrams illustrating an example of full charging and discharging, and an example of partial charging and discharging, in accordance with an embodiment.

Referring to FIG. 4A, a graph 410 shows a change in voltage when a battery is fully charged and discharged. In the graph 410, a horizontal axis represents a time and a vertical axis represents a voltage level of the battery. The graph 410 shows a constant current charge interval, and related descriptions will be omitted for conciseness. In the graph 410, a full charge level is 4.2 V, and a full discharge level is 2.7 V. The battery is fully charged during times or time periods 411 through 415, and fully discharged during times or time periods 421 through 425. When the battery is fully charged, a battery information preprocessing apparatus 210 of FIG. 2, for instance, acquires information on a state change in the battery during the times 411 through 415. Based on the acquired information, the battery information preprocessing apparatus detects reference time information indicating information on a time during which the voltage level of the battery is changed through the constant current charge based on voltage intervals for each cycle in which the full charging and discharging is performed.

Referring to FIG. 4B, a graph 450 shows a change in voltage when the battery is partially charged and discharged. In the graph 450, a horizontal axis represents a time, and a vertical axis represents a voltage level of the battery. In the graph 450, a full charge level is 4.2 V, and a full discharge level is 2.7 V. The battery may be partially charged during times 451 through 455, and partially discharged during times 461 through 465. When the battery is partially charged, the battery information estimation apparatus 320 of FIG. 3, for instance, detects a time among the times 451 through 455 during which the battery is partially charged. Based on reference time information and reference SoH information detected from the battery information preprocessing apparatus 210, the battery information estimation apparatus 320 detects SoH information on the battery corresponding to the detected time and the voltage level of the battery changed during the detected time.

Figure 5:
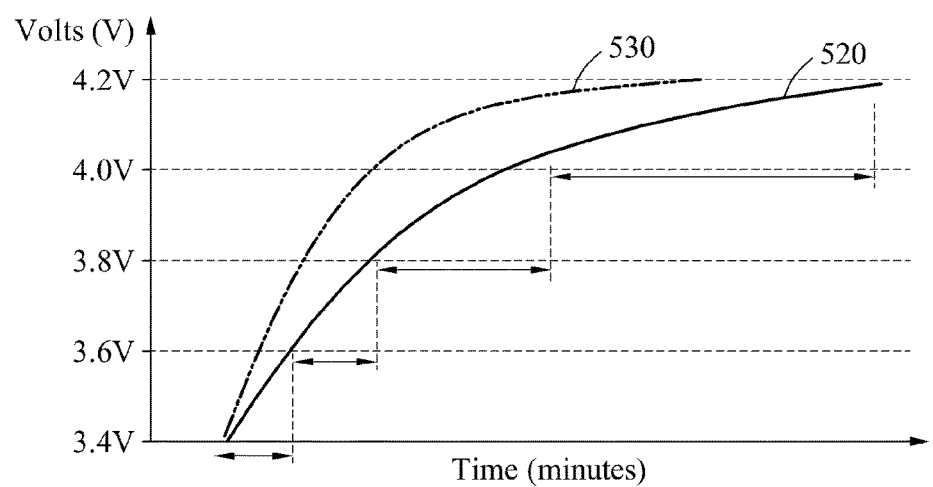
Figure 7:
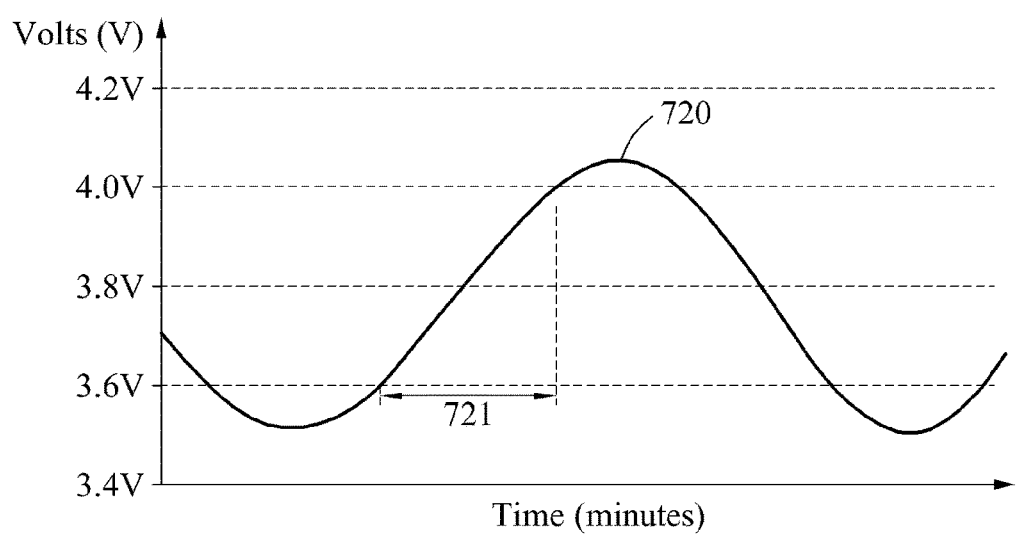

FIGS. 5 through 7 are diagrams illustrating examples of estimating SoH information.

Referring to FIG. 5, a graph 510 shows a CCCT based on a number of cycles in which a battery is fully charged and discharged. In the graph 510, a horizontal axis represents a time and a vertical axis represents a voltage level of the battery. A curve 520 indicates a CCCT corresponding to first full charging and discharging, and a curve 530 indicates a CCCT corresponding to $N^{th}$ full charging and discharging, N being a number greater than 1, for instance.

The CCCT is reduced according to an increase in the number of cycles in which full charging and discharging is performed. For example, when a time during which the voltage of the battery corresponding to the first full charging and discharging performed in a first voltage interval from 3.4 V to 3.6 V is 50 minutes, a time during which the voltage level of the battery corresponding to $200^{th}$ full charging and discharging performed is 40 minutes. A reason for this example is that a capacity of the battery is reduced according to internal degradation attributed to the number of cycles in which the full charging and discharging is performed.

Referring to FIG. 6, a lookup table 610 includes reference time information indicating information of a time during which a voltage level of a battery, being fully charged and discharged, changes based on predetermined voltage intervals. The reference time information is classified for each cycle 611 in which full charging and discharging is performed. The reference time information in the lookup table 610 is classified based on the cycle 611, represented as a vertical axis, and predetermined voltage intervals 621 through 624, represented as a horizontal axis. For example, in the lookup table 610, a time or a time period during which the voltage level of the battery corresponding to $300^{th}$ full charging and discharging is changed from 4.0 V to 4.2 V is 540 minutes. In an example, the lookup table 610 includes reference SoH information 631 corresponding to the reference time information.

Referring to FIG. 7, a graph 710 shows a voltage level of a battery being partially charged and discharged. In the graph 710, a horizontal axis represents a time, and a vertical axis represents a voltage level of the battery.

When the voltage level of the battery being partially charged and discharged is changed as indicated by a curve 720, a battery information estimation apparatus 320 of FIG. 3, for instance, detects a time during which the voltage level of the battery is changed and, based on the lookup table 610 of FIG. 6, extracts SoH information on the battery corresponding to the changed voltage level and the detected time. The voltage interval of the lookup table 610 is classified into a first interval 621 from 3.4 V to 3.6 V, a second interval 622 from 3.6 V to 3.8 V, a third interval 623 from 3.8 V to 4.0 V, and a fourth interval 623 from 4.0 V to 4.2 V. The battery information estimation apparatus 320 detects a voltage interval mapped to the changed voltage level from among the first interval 621, the second interval 622, the third interval 623, and the fourth interval 624. For example, in the graph 710, the voltage level of the battery changes from 3.5 V to 4.05 V. Thus, the battery information estimation apparatus 320 detects the second interval 622 and the third interval 623 corresponding to a voltage level between 3.5 V and 4.05 V from among the first interval 621, the second interval 622, the third interval 623, and the fourth interval 624, as the voltage interval mapped to the changed voltage level.

The battery information estimation apparatus 320 detects a time or a time period 721 during which the voltage level of the battery is changed to correspond to the second interval 622 and the third interval 623. Based on the lookup table 610 of FIG. 6, the battery information estimation apparatus 320 extracts a time or a time period mapped to the time 721 from items of time information on times 641 through 646 corresponding to the second interval 622 and the third interval 623. For example, when the time or the time period 721 is 360 minutes, the battery information estimation apparatus extracts the times 643 and 644 mapped to 360 minutes. The battery information estimation apparatus 320 extracts SoH information 651 corresponding to the times 643 and 644 from the reference SoH information 631, as the SoH information on the battery. Accordingly, the SoH information on the battery is estimated to be 0.9.

In an example, when the plurality of items of time information corresponding to the second interval 622 and the third interval 623 only includes the times 641 through 646, and when the time 721 is 340 minutes, the time mapped to the time 721 is absent in the lookup table 610. In this example, the battery information estimation apparatus 320 interpolates the items of time information corresponding to the second interval 622 and the third interval 623. For example, the battery information estimation apparatus 320 operates an average value between 360 minutes including the times 643 and 644 and 320 minutes including the times 645 and 646, to be 340 minutes, and then maps the time 721 to the average value. Accordingly, the SoH information on the battery is estimated to be 0.85 corresponding to an average value between SoH information 651 and SoH information 652.

In another example, a voltage interval mapped to the changed voltage level is absent in the first interval 621 through the fourth interval 624 of the lookup table 610. For example, in the graph 710 of FIG. 7, when the voltage level of the battery is changed from 3.6 V to 3.7 V, not from 3.5 V to 4.05 V, the voltage level changed from 3.6 V to 3.7 V is not mapped to the first interval 621 through the fourth interval 624. The battery information estimation apparatus 320 maps the voltage level changed from 3.6 V to 3.7 V by interpolating the first interval 621 through the fourth interval 624 of the lookup table 610. For example, the battery information estimation apparatus 320 divides the second interval 622 and the plurality of items of time information including the times 641, 643, and 645 corresponding to the second interval 622. Accordingly, the second interval 622 may be divided into a second interval-1 from 3.6 V to 3.7 V, and a second interval-2 from 3.7 V to 3.8 V. Items of time information corresponding to each of the second interval-1 and the second interval-2 are a half of the items of information on the times 641, 643, and 645. The battery information estimation apparatus 320 maps the voltage level changed from 3.6 V to 3.7 V to the second interval-1. When a time during which the voltage level of the battery is changed from 3.6 V to 3.7 is 45 minutes corresponding to a half of the time 643, the battery information estimation apparatus 320 estimates the SoH information corresponding to the time 643, to be the SoH information of the battery.

FIGS. 8A and 8B are diagrams illustrating examples of predetermined reference information classified based on a charging rate of a battery, in accordance with an embodiment.

Referring to FIGS. 8A and 8B, the predetermined reference information includes lookup tables 810 and 820. The lookup table 810 shows reference time information on a battery charged rapidly, for example, at a rate of 3 A in a constant current charge interval. The lookup table 820 shows reference time information on the battery charged slowly, for example, at a rate of 1 A in the constant current charge interval. The battery information preprocessing apparatus 320 of FIG. 3, for example, generates a lookup table for each charging rate of the battery, and stores lookup tables, for example, the lookup tables 810 and 820, classified for each charging rate of the battery, thereby estimating SoH information on the battery based on the lookup tables.

Figure 9:
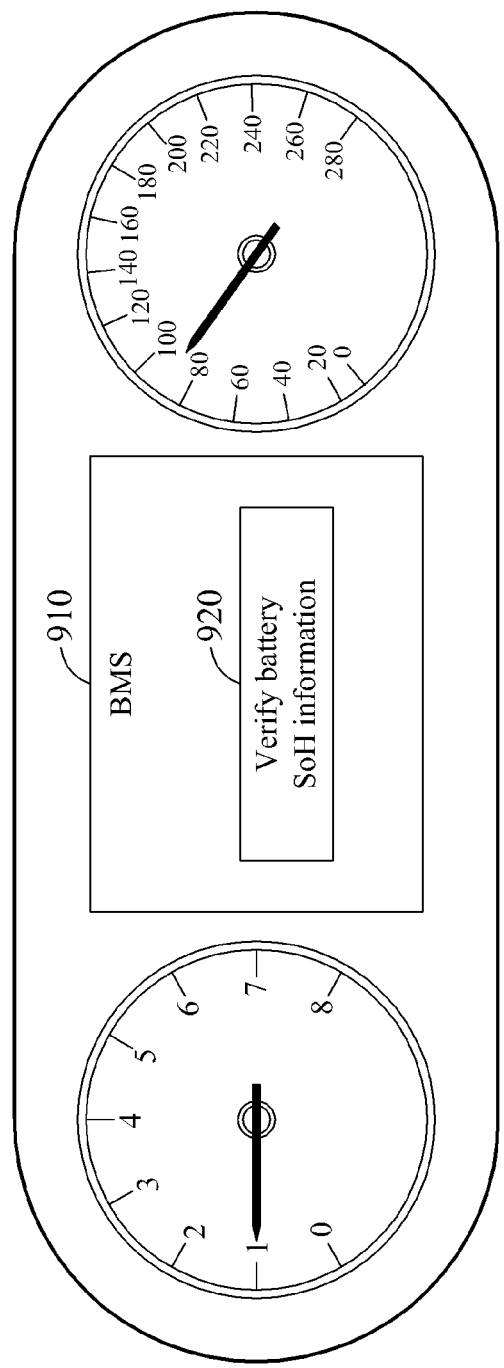
FIG. 9 is a diagram illustrating an example of a user interface to estimate the battery information, in accordance with an embodiment.

FIG. 9 is a diagram illustrating an example of a user interface for estimating battery information, in accordance with an embodiment.

Referring to FIG. 9, a battery control apparatus receives a trigger signal from an external source, and extracts information from battery modules in response to the trigger signal. Accordingly, the battery control apparatus estimates SoH information of the battery, regardless of whether the battery is electrically stable when the battery is partially charged. For example, when an ignition of an EV, including the battery control apparatus, and the battery is turned on, an ECU displays a user interface 910 on a dashboard. The user interface 910 includes an interface 920 configured to generate a trigger signal. When a user selects the interface 920, the ECU transmits a trigger signal to the battery control apparatus. The battery control apparatus determines whether the battery is partially charged. When the battery is partially charged, the battery control apparatus detects a time during which a voltage level of the battery is changed through a constant current charge, and extracts the SoH information of the battery corresponding to the changed voltage level and the detected time based on predetermined reference information. In an example, the battery control apparatus transmits the extracted SoH information to the ECU. The ECU may display the SoH information received from the battery control apparatus.

Figure 10:
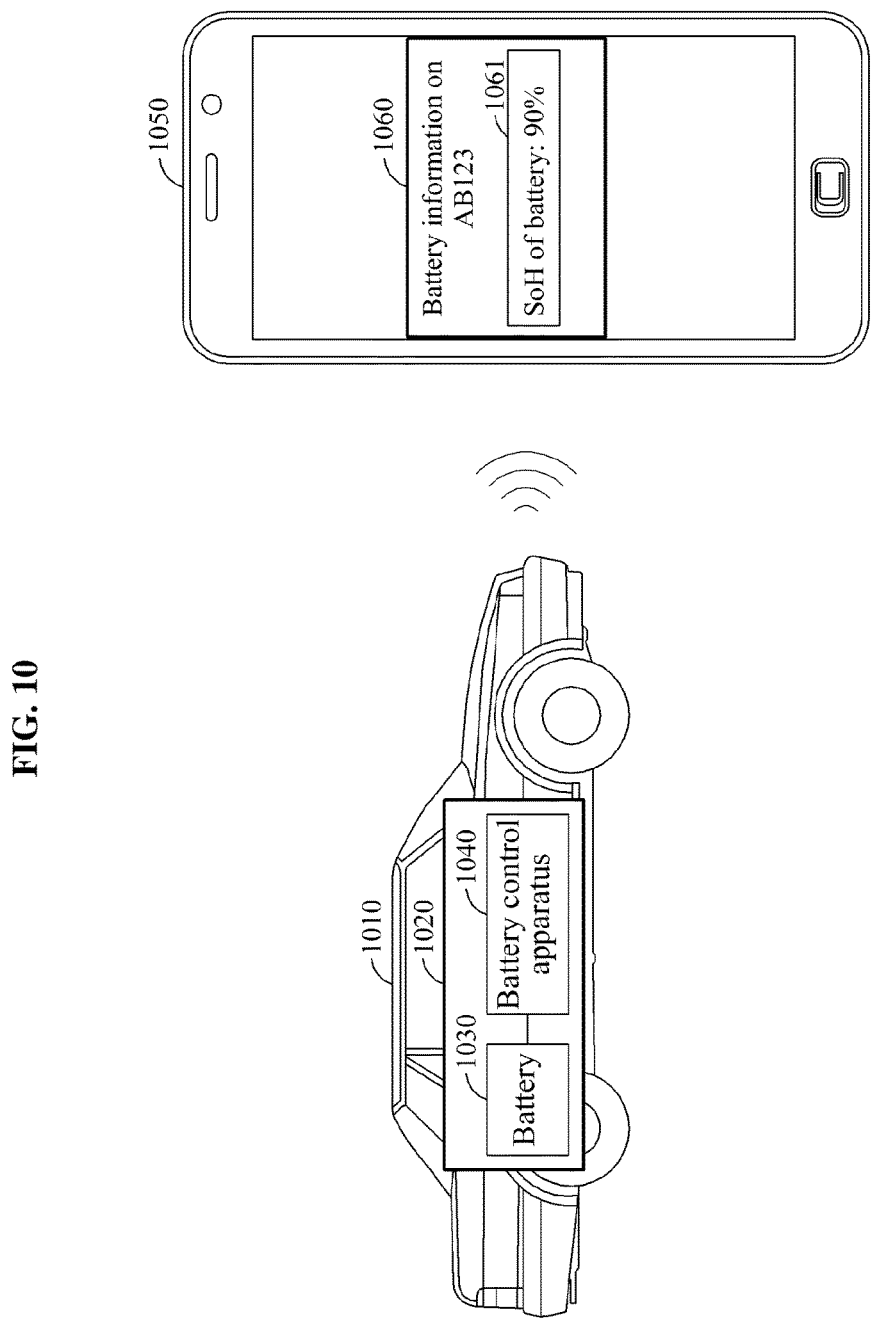
FIG. 10 is a diagram illustrating an example of a user interface to provide the battery information, in accordance with an embodiment.

FIG. 10 is a diagram illustrating an example of a user interface to provide battery information, in accordance with an embodiment.

Referring to FIG. 10, an EV 1010 includes a battery system 1020. The battery system 1020 includes a battery 1030 and a battery control apparatus 1040. The battery control apparatus 1040 extracts SoH information from the battery 1030, and transmits the SoH information of the battery 1030 to a terminal 1050 using a wireless interface.

In an example, the battery control apparatus 1040 determines whether the battery 1030 is partially charged. When the battery 1030 is partially charged, the battery control apparatus 1040 detects a time during which a voltage level of the battery 1030 changes through a constant current charge, and extracts the SoH information on the battery 1030 corresponding to the changed voltage level and the detected time, based on predetermined reference information. In an example, the battery control apparatus 1040 receives a trigger signal from the terminal 1050 via the wireless interface and, in response to the trigger signal, determines whether the battery 1030 is partially charged.

The battery control apparatus 1040 transmits the extracted SoH information 1061 to the terminal 1050 via the wireless interface. The terminal 1050 displays the received SoH information 1061 using a user interface 1060.

Figure 11:
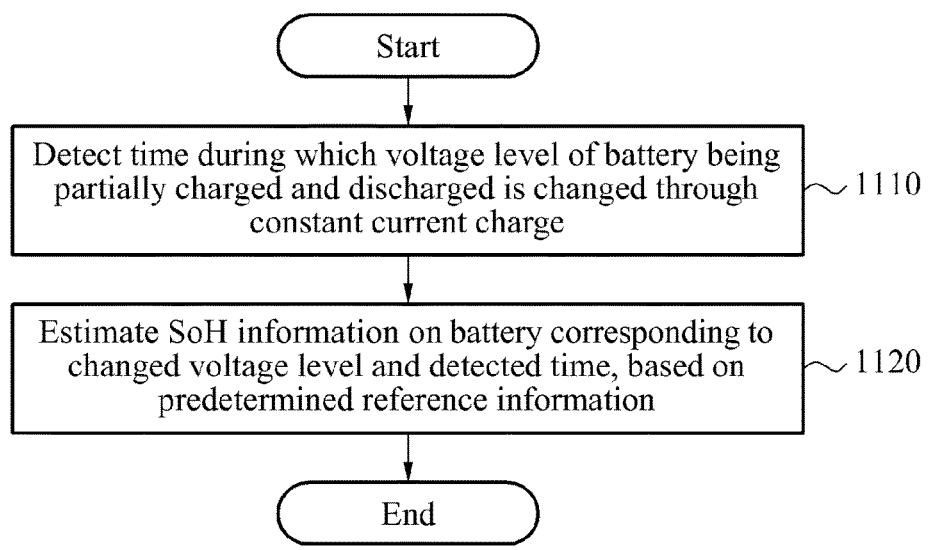
FIG. 11 is a flowchart illustrating an example of a battery information estimation method, in accordance with an embodiment.

FIG. 11 is a flowchart illustrating an example of a battery information estimation method performed in a battery information estimation apparatus, in accordance with an embodiment.

Referring to FIG. 11, in operation 1110, a battery information estimation method detects a time during which a voltage level of a battery, being partially charged and discharged, is changed through a constant current charge. In this example, the battery information estimation method detects the changed voltage level, and measures the time during which the voltage level is changed, thereby detecting the time during which the voltage level of the battery is changed. Predetermined reference information includes reference time information indicating information on a time during which a voltage level of a battery, being fully charged and discharged, changes through the constant current charge based on predetermined voltage intervals, and reference SoH information indicating SoH information on the battery being fully charged and discharged. The reference time information and the reference SoH information are classified for each cycle in which full charging and discharging is performed.

In operation 1120, the battery information estimation method estimates the SoH information on the battery corresponding to the changed voltage level and the detected time, based on the predetermined reference information. The battery information estimation apparatus detects a voltage interval mapped to the changed voltage level from among voltage intervals, and extracts a time mapped to the detected time from items of time information corresponding to the mapped voltage interval in the reference time information. Based on the mapped time, the battery information estimation method extracts the SoH information from the battery being partially charged and discharged.

Descriptions with respect to the battery information estimation method of FIG. 11 will be omitted for increased clarity and conciseness because the descriptions provided with reference to FIGS. 1 through 10 are also applicable thereto.

Figure 12:
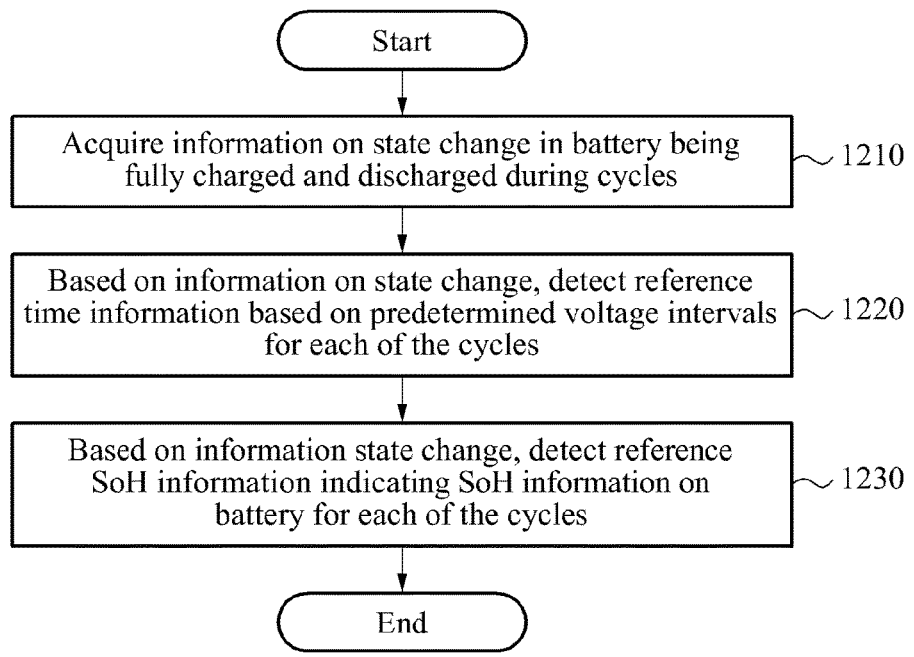
FIG. 12 is a flowchart illustrating an example of a battery information preprocessing method, in accordance with an embodiment.

FIG. 12 is a flowchart illustrating an example of a battery information preprocessing method performed at a battery information preprocessing apparatus, in accordance with an embodiment.

Referring to FIG. 12, in operation 1210, a battery information preprocessing method acquires information on a state change in a battery being fully charged and discharged during cycles.

In operation 1220, based on the information on the state change, the battery information preprocessing method detects reference time information, which indicates information of a time during which a voltage level of the battery is changed through a constant current charge, based on predetermined voltage intervals for each of the cycles.

In operation 1230, based on the information on the state change, the battery information preprocessing method detects reference SoH information indicating SoH information on the battery for each of the cycles.

Descriptions with respect to the battery information preprocessing method of FIG. 12 will be omitted for increased clarity and conciseness because the descriptions provided with reference to FIGS. 1 through 10 are also applicable thereto.

Figure 13:
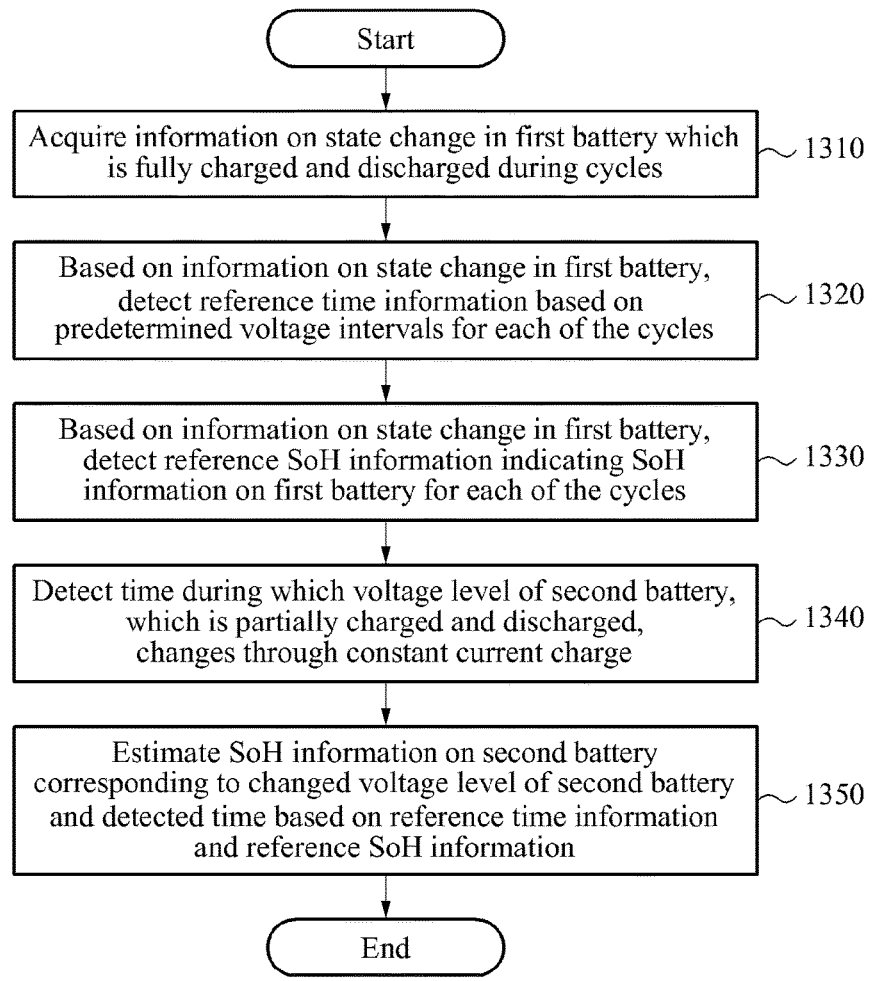
FIG. 13 is a flowchart illustrating another example of a battery information estimation method, in accordance with an embodiment.

FIG. 13 is a flowchart illustrating another example of a battery information estimation method performed at a battery information estimation apparatus, in accordance with an embodiment.

Referring to FIG. 13, in operation 1310, a battery information estimation method acquires information on a state change in a first battery, which is fully charged and discharged during cycles.

In operation 1320, based on the information on the state change in the first battery, the battery information estimation method detects reference time information indicating information on a time during which a voltage level of the first battery changes through a constant current charge, based on predetermined voltage intervals during each of the cycles.

In operation 1330, based on the information on the state change in the first battery, the battery information estimation method detects reference SoH information indicating SoH information on the first battery for each of the cycles.

In operation 1340, the battery information estimation method detects a time during which a voltage level of a second battery, which is partially charged and discharged, changes through the constant current charge.

In operation 1350, the battery information estimation method estimates SoH information on the second battery corresponding to the changed voltage level and the detected time based on the reference time information and the reference SoH information.

Descriptions with respect to the battery information estimation method of FIG. 13 will be omitted for increased clarity and conciseness because the descriptions provided with reference to FIGS. 1 through 10 are also applicable thereto.

The units, estimator, determiner, detector, and acquirer described herein may be implemented using hardware components. For example, the hardware components may include processors, controllers, amplifiers, band-pass filters, audio to digital convertors, and processing devices. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

It is to be understood that in the embodiment of the present invention, the operations in FIGS. 11-13 are performed in the sequence and manner as shown although the order of some operations and the like may be changed without departing from the spirit and scope of the described configurations. In accordance with an illustrative example, a computer program embodied on a non-transitory computer-readable medium may also be provided, encoding instructions to perform at least the method described in FIGS. 11-13.

Program instructions to perform a method described in FIGS. 11-13, or one or more operations thereof, may be recorded, stored, or fixed in one or more computer-readable storage media. The program instructions may be implemented by a computer. For example, the computer may cause a processor to execute the program instructions. The media may include, alone or in combination with the program instructions, data files, data structures, and the like. Examples of computer-readable media include magnetic media, such as hard disks, floppy disks, and magnetic tape; optical media such as CD ROM disks and DVDs; magneto-optical media, such as optical disks; and hardware devices that are specially configured to store and perform program instructions, such as read-only memory (ROM), random access memory (RAM), flash memory, and the like. Examples of program instructions include machine code, such as produced by a compiler, and files containing higher level code that may be executed by the computer using an interpreter. The program instructions, that is, software, may be distributed over network coupled computer systems so that the software is stored and executed in a distributed fashion. For example, the software and data may be stored by one or more computer readable recording mediums. Also, functional programs, codes, and code segments for accomplishing the example embodiments disclosed herein may be easily construed by programmers skilled in the art to which the embodiments pertain based on and using the flow diagrams and block diagrams of the figures and their corresponding descriptions as provided herein.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A battery information estimation apparatus in a battery management system, the apparatus comprising:
 a processor comprising:
  a time detector configured to detect respective times during which a measured voltage level of a battery, being partially charged and discharged, changes to correspond to a plurality of predetermined voltage intervals through a constant current charge, the measured voltage level being measured using a sensor; and
  a state of health (SoH) information estimator configured to:
   determine respective voltage intervals, belonging to measured voltage levels of the battery during the detected respective times, from among the plurality of predetermined voltage intervals included in predetermined reference information,
   determine time information corresponding to the detected respective times, from among items of time information included in the predetermined reference information, the items being determined to be mapped to the determined respective voltage intervals, and
   estimate state of health (SoH) information of the battery based on a SoH reference value being mapped to the determined time information using reference SoH information included in the predetermined reference information.

2. The apparatus of claim 1, wherein the time detector comprises:
 a voltage detector configured to detect the changed voltage level being measured using the sensor; and
 a time measurer configured to measure the respective times during which the measured voltage level changes to correspond to the plurality of predetermined voltage ranges.

3. The apparatus of claim 1, further comprising:
 a charge state determiner configured to determine whether the battery is in a charge state,
 wherein the time detector is configured to detect the respective times during which the voltage level changes in response to the charge state determiner determining that the battery is in the charge state.

4. The apparatus of claim 1, wherein the predetermined reference information comprises reference time information including the items of time information, and comprises the reference SoH information including the SoH reference value.

5. The apparatus of claim 4, wherein the predetermined reference information indicates a lookup table.

6. The apparatus of claim 4, wherein the reference time information and the reference SoH information are classified for each cycle in which reference batteries are fully charged and discharged, and the reference batteries includes the battery.

7. The apparatus of claim 4, wherein the reference time information and the reference SoH information are classified for each charging rate of the battery.

8. The apparatus of claim 4, wherein the SoH information estimator is configured to detect the respective voltage intervals, being determined to be mapped to the measured voltage levels, from among the plurality of predetermined voltage intervals.

9. The apparatus of claim 8, wherein the SoH information estimator is configured to extract the determined time information from the reference time information and, extract the SoH reference value from the reference SoH information.

10. The apparatus of claim 8, wherein in response to the SoH information estimator failing to detect the respective voltage intervals, being determined to be mapped to the changed voltage level, from among the plurality of predetermined voltage intervals, the SoH information estimator is configured to extract a voltage interval mapped to the changed voltage level by interpolating the plurality of predetermined voltage intervals, and extract times mapped to the detected respective times from among the items of time information corresponding to the extracted voltage interval.

11. The apparatus of claim 8, wherein, in response to the SoH information estimator failing to determine the time information corresponding to or being mapped to the detected respective times from among the items of time information, the SoH information estimator is configured to extract times corresponding to or being mapped to the detected respective times by interpolating the items of time information corresponding to the mapped respective voltage intervals.

12. The apparatus of claim 1, wherein the SoH information estimator is further configured to prevent the battery from overcharging and overdischarging, and control battery modules in the battery to be in equal charge states by performing cell balancing.

13. The apparatus of claim 1, wherein the SoH information estimator is further configured to estimate a state of charge (SoC) information and a state of function (SoF) information, wherein the SoC information is information on an amount of charges held in the battery, and the SoF information indicates information on a degree to which the performance of the battery matches a predefined condition.

14. The apparatus of claim 1, wherein in response to the battery being partially charged and discharged, the SoH information estimator is configured to estimate the SoH information on the battery by detecting a constant current charging time (CCCT) based on the predetermined reference information.

15. The apparatus of claim 1, wherein the battery is charged at a constant current until the measured voltage level of the battery reaches a predefined voltage level, and
 when the measured voltage level of the battery reaches the predefined voltage level, the battery is charged using a constant voltage until a current level reaches a predefined current level.

16. A battery information preprocessing apparatus in a battery management system, the apparatus comprising:
 a processor comprising:
  a state change information acquirer configured to acquire information about a state change of a battery being fully charged and discharged during cycles, the information about the state change being measured using a sensor and indicating a time consumed during a full cycle of charging and discharging for each cycle of charging the battery at a constant current between two voltage levels, and charging the battery at a constant voltage in response to a higher of the two voltage levels being reached; and a reference state of health (SoH) information detector configured to detect, based on the information about the state change, reference SoH information corresponding to a degree of degradation of the battery for each of the cycles, the reference SoH information being a ratio between the time consumed during the full cycle of charging and discharging and a time consumed during a first full cycle of charging and discharging, wherein the processor is configured to generate reference information, using the information about the state change and the reference SoH information, for estimating a SOH of the battery; and a memory electrically coupled to the processor and configured to store the generated reference information including reference time information and the reference SoH information.

17. The apparatus of claim 16, wherein the state change information acquirer is configured to acquire information on a capacity change of the battery based on the cycles in which the battery is fully charged and discharged.

18. The apparatus of claim 17, wherein the reference SoH information detector is configured to operate at a ratio between a capacity of the battery corresponding to the first full charging and discharging and a capacity of the battery corresponding to $N^{th}$ full charging and discharging, N being a number of the cycles, and extract SoH information of the battery as a ratio of time consumed to charge the battery between two voltage levels at the $N^{th}$ full charging and discharging cycle to a time consumed to charge the battery between the two voltage levels at the first full charging and discharging cycle.

19. The apparatus of claim 16, wherein the processor is configured to classify a voltage interval in which the battery is fully charged into the voltage intervals.

20. The apparatus of claim 16, wherein the processor is configured to classify the reference time information for each charging rate of the battery, and the reference SoH information detector is configured to classify the reference SoH information for each charging rate of the battery.

21. A processor-implemented battery information estimation method performed by a computing apparatus in a battery management system, the method comprising:

detecting, using one or more processors of the computing apparatus, respective times during which a measured voltage level of a battery being partially charged and discharged, changes to correspond to a plurality of predetermined voltage intervals through a constant current charge, the measured voltage level being measured using a sensor;

determining, using the one or more processors, respective voltage intervals, belonging to measured voltage levels of battery during the detected respective times, from among the plurality of predetermined voltage intervals included in predetermined reference information;

determining, using the one or more processors, time information corresponding to the detected respective times, from among items of time information included in the predetermined reference information, the items being determined to be mapped to the determined respective voltage intervals; and estimating, using the one or more processors, state of health (SoH) information of the battery based on a SoH reference value being mapped to the determined time information using reference SoH information included in the predetermined reference information.

22. A processor-implemented battery information preprocessing method performed by a computing apparatus in a battery management system, the method comprising:

acquiring, using one or more processors of the computing apparatus, information on a state change of a battery being fully charged and discharged during cycles, the information on the state change being measured using a sensor indicating a time consumed during a full cycle of charging and discharging for each cycle, by charging the battery at a constant current between the two voltage levels, and charging the battery at a constant voltage in response to a higher of the two voltage levels being reached;

detecting, using the one or more processors and based on the information on the state change, reference state of health (SoH) information corresponding to a degree of degradation of the battery for each of the cycles, the reference SoH information being a ratio between the time consumed during the full cycle of charging and discharging and a time consumed during a first full cycle of charging and discharging; and generating reference information, using the information on the state change and the reference SoH information, for estimating a SOH of the battery.

23. A processor-implemented battery information estimation method performed by a computing apparatus in a battery management system, the method comprising:

acquiring, using one or more processors of the computing apparatus, information on a state change of a first battery, which is fully charged and discharged, during cycles during which a voltage level of the first battery is changed, through a constant current charge, based on voltage intervals for each of the cycles, to generate reference information for a second battery;

detecting, using the one or more processors and based on the information on the state change of the first battery, reference state of health (SoH) information indicating SOH information on the first battery for each of the cycles to generate the reference information for the second battery;

detecting, using the one or more processors, respective times during which a measured voltage level of a second battery, which is partially charged and discharged, changes to correspond to a plurality of predetermined voltage intervals through the constant current charge, the measured voltage level being measured using a sensor;

determining, using the one or more processors, voltage intervals, belonging to measured voltage levels of the second battery during the detected respective time from among the plurality of predetermined voltage intervals included in the generated reference information, determining, using the one or more processors, time information corresponding to the detected respective times, from among items of time information included in the predetermined reference information, the items being determined to be mapped to the determined voltage interval; and estimating, using the one or more processors, state of health (SoH) information of the second battery based on a SoH reference value being mapped to the determined time information using the reference SoH information included in the generated reference information.

* * * * *